United States Patent
Slater et al.

(10) Patent No.: US 7,805,262 B2
(45) Date of Patent: Sep. 28, 2010

(54) UTILITY METER USING TEMPERATURE COMPENSATION

(75) Inventors: Byron J. Slater, Hermosa Beach, CA (US); John T. Voisine, Lafayette, IN (US)

(73) Assignee: Landis + Gyr, Inc., Lafayette, IN (US)

( * ) Notice: Subject to any disclaimer, the term of this patent is extended or adjusted under 35 U.S.C. 154(b) by 2684 days.

(21) Appl. No.: 09/995,844

(22) Filed: Nov. 28, 2001

(65) Prior Publication Data

US 2008/0036447 A1 Feb. 14, 2008

Related U.S. Application Data

(60) Provisional application No. 60/325,074, filed on Sep. 25, 2001.

(51) Int. Cl.
*G01R 21/00* (2006.01)
(52) U.S. Cl. .................................... 702/61
(58) Field of Classification Search .............. 702/61
See application file for complete search history.

(56) References Cited

U.S. PATENT DOCUMENTS

| | | | |
|---|---|---|---|
| 4,198,677 A | 4/1980 | Brunner et al. | |
| 4,327,416 A | 4/1982 | Jerrim | |
| 4,480,312 A * | 10/1984 | Wingate | 702/130 |
| 4,998,061 A | 3/1991 | Voisine et al. | |
| 5,230,564 A | 7/1993 | Bartilson et al. | |
| 5,416,860 A | 5/1995 | Lee et al. | |
| 5,640,085 A * | 6/1997 | Petr et al. | 324/105 |
| 5,644,271 A * | 7/1997 | Mollov et al. | 331/176 |
| 5,847,560 A | 12/1998 | Bosselmann et al. | |
| 5,889,442 A * | 3/1999 | Ouellette et al. | 331/173 |
| 5,895,912 A | 4/1999 | Bosselmann et al. | |
| 5,940,786 A * | 8/1999 | Steeby | 702/132 |
| 6,847,300 B2 * | 1/2005 | Yee et al. | 340/584 |
| 2003/0004661 A1 * | 1/2003 | Burns et al. | 702/61 |

* cited by examiner

*Primary Examiner*—Aditya Bhat
(74) *Attorney, Agent, or Firm*—Maginot Moore & Beck

(57) ABSTRACT

A utility meter having a temperature compensation function provides advantages such as improved time keeping accuracy. According to an exemplary embodiment, a utility meter includes at least one sensor for detecting an ambient temperature at a location corresponding to a component such as a crystal oscillator that enables a time keeping function of the meter, and generating an output signal representative of the detected ambient temperature. A device such as a digital signal processor adjusts at least one clock maintained by the time keeping function of the meter in dependence upon the output signal from the at least one sensor.

20 Claims, 3 Drawing Sheets

UTILITY METER USING TEMPERATURE COMPENSATION

This application claims the benefit of U.S. Provisional Patent Application Ser. No. 60/325,074, filed Sep. 25, 2001, and which is incorporated herein by reference.

FIELD OF THE INVENTION

The present invention generally relates to utility meters, and more particularly, to utility meters that employ a time reference upon which at least some metering operations or metering information depend.

BACKGROUND OF THE INVENTION

Utility meters are devices that, among other things, measure the consumption of a utility provided commodity, such as electric energy, gas, or water, by a residence, factory, commercial establishment or other such facility. Utility service providers, or simply utilities, employ utility meters to track individual customers' usage of utility provided commodities. Utilities track customer usage for many purposes, including billing and tracking demand for the relevant consumed commodity.

Utilities are frequently required by state or local regulations or by customers to verify the accuracy of meters operating in the field. To satisfy these requirements, utility meters are typically subjected to stringent testing and calibration during and after manufacture. In general, if the results of testing indicate that a given meter is not operating at a desired degree of accuracy, the meter may be calibrated or adjusted to bring the meter within the desired tolerances.

One factor affecting the accuracy of utility meters is ambient temperature. In particular, ambient temperature variations often affect a meter's ability to measure time accurately. This is particularly significant since meters typically use time as a basis for measuring customer usage of utility provided commodities. Accordingly, time measurement errors may cause a meter to generate faulty customer usage information, thereby resulting in customer overbilling or underbilling.

Examples of time-based metering operations include demand metering and time-of-use metering, which are commonly used in electricity metering. Demand metering is a type of revenue metering that measures the amount of energy used in discrete increments of time, for example, every half-hour or hour, and then bases the cost of electrical energy on the highest demand intervals. Time of use metering employs different energy rates at different times of the day. For example, electrical energy may cost more during the afternoon in the summer months than at night during the winter months.

Demand metering and time-of-use metering thus require fairly accurate time reference clocks, for example, real time calendar/clocks, to ensure that the billing amounts are fair and accurate. Time reference clocks may likewise be employed for other functions in electricity meters as well as other types of meters. Accuracy of such clocks is clearly desirable.

Many electricity meters for the U.S. market have historically used the 60 Hz power line frequency as a time reference since it is synchronized to the National Bureau of Standards and exhibits reasonably high accuracy. However, line power is not available during a power outage. In the past, when meters only measured total customer usage of a commodity, the use of the line frequency as a time reference was sufficient since no data was acquired during the loss of power, and therefore, no time reference was required.

With the advent of electronic meters, however, and the consequent increase in use of real time clock information, there is an increased requirement to maintain a time keeping function during power outages so that when power is restored, the time and date references within the meter are accurate. To keep time during power outages, electricity meters often employ crystal-based clocks.

Crystal oscillators, however, are susceptible to operational variations based on ambient temperature variations. Such operational variations can result in significant inaccuracies in time-keeping even during short duration power outages. Moreover, for non-electricity meters that rely on crystal oscillators full-time, inaccuracies could be substantial.

Accordingly, there is a need for a utility meter capable of compensating for ambient temperature variations in order to, among other things, maintain time keeping accuracy. The present invention addresses these and other issues.

SUMMARY OF THE INVENTION

The present invention addresses the above described need, as well as others, by providing a sensor and other circuitry that detects the temperature proximate a time keeping component and adjusts a time keeping function in dependence upon the detected temperature. Thus, variations that affect the operation of the time keeping component are detected and compensated for.

In a first embodiment according to the present invention, an arrangement for adjusting a time keeping function of a utility meter includes at least one sensor and a processing circuit. The at least one sensor is configured to detect a temperature at a location proximate a time keeping component. The time keeping component generates timing signals at a rate that varies as a function of temperature. The sensor(s) is/are further configured to generate an output signal representative of the detected temperature. The processing circuit is configured to adjust at least one clock maintained by the time keeping function of the meter in dependence upon the output signal from the at least one sensor.

In a second embodiment of the invention, an electricity meter includes a source of commodity consumption information, at least one sensor, and a processing circuit. The at least one sensor configured to detect a temperature at a location proximate a time keeping component. The time keeping component generates timing signals at a rate that varies as a function of temperature. The sensor(s) is/are further configured to generate an output signal representative of the detected temperature. The processing circuit is coupled to receive commodity consumption information from the source of commodity consumption information, and is operable to generate metering data based on the commodity consumption information and real time clock information. The processing circuit is further operable to adjust the real time clock information in dependence upon the output signal from the at least one sensor.

The above described embodiments both employ a sensor to detect temperature in the vicinity of a temperature sensitive component and then adjust a time keeping function dependent upon the detected temperature. As a result, the invention compensates for inaccuracy of the temperature sensitive component due to changes in temperature. Such compensation may be combined with other types of clock calibration schemes known in the art.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein.

The exemplifications set out herein illustrate preferred embodiments of the invention, and such exemplifications are not to be construed as limiting the scope of the invention in any manner.

DETAILED DESCRIPTION

Figure 1:
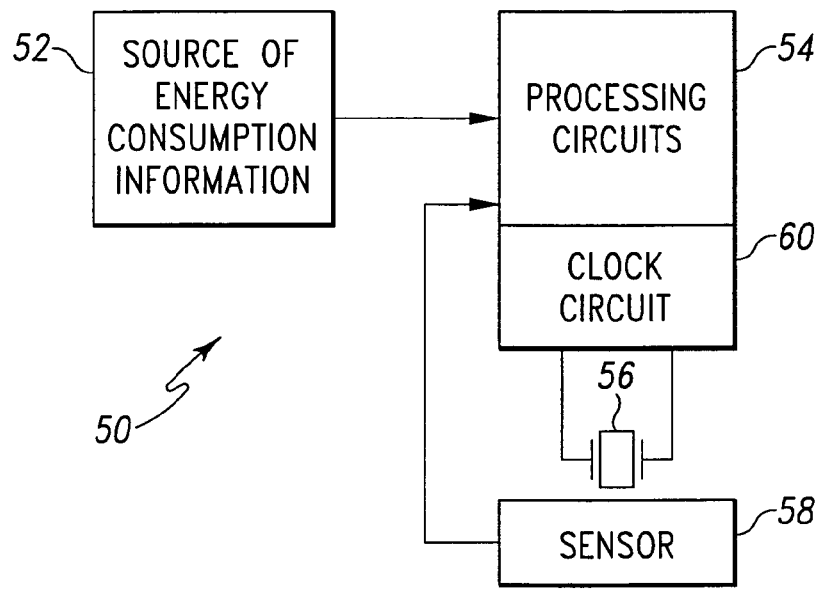
FIG. 1 is a schematic block diagram of a commodity consumption meter according to the present invention.

FIG. 1 shows a block diagram schematic representation of a utility meter 50 that includes a time keeping function. The time keeping function preferably includes a real-time clock that is used to generate time-dependent metering information. Time dependent metering information may include commodity consumption methods over predetermined periods of time, or using time-dependent commodity consumption rates.

In accordance with the present invention, the utility meter 50 includes comprises a source of energy consumption information 52, a processing circuit 54, a temperature dependent time keeping component 56, a sensor 58, and a clock circuit 60.

In general, the time keeping component 56 and the clock circuit 60 perform the time keeping function of the meter 50. To this end, the time keeping component 56 may suitably be a crystal oscillator or other device that generates timing signals from which a clock may be maintained. The clock circuit 60, which may suitably be carried out as software executed within the processing circuit 54, maintains clock information within the meter 50. To this end, the clock circuit 60 is operable to receive timing signals generated by the time keeping component 56 and accumulate clock information based thereon. In accordance with embodiment of the present invention, the clock information may suitably be real-time clock information. Such information may be used to time stamp various commodity consumption measurements, and/or perform metering real-time dependent metering operations. The maintenance and use of a real-time clock as described above is well known to those of ordinary skill in the art and may take many forms.

The source of commodity consumption information 52 is a circuit that generates commodity consumption information indicative of commodity usage. For example, the source of commodity consumption information may include a circuit that measures electrical energy consumption. Alternatively, the source 52 may comprise flow meters and associated circuits that measure natural gas or water consumption. In any event, the source 52 is operably connected to provide the commodity consumption information to the processing circuit 54.

The processing circuit 54 is operable to generate metering information from the commodity consumption information. It will be appreciated that because the flexibility and multitasking capability of processors, one or more of the processors of the processing circuit 54 may also perform operations as part of the source of commodity consumption information 52. In any event, the metering information may include accumulated totals of the commodity that has been consumed, which may be used for billing purposes. The metering information also includes time-dependent qualities. For example, in an electricity meter that performs demand metering, the processing circuit 54 generates metering information regarding accumulated energy usage over defined time intervals, as is known in the art. To generate time dependent metering information, the processing circuit 54 receives the time information generated by the clock circuit 60.

As will be discussed below, the processing circuit 54 also cooperates with the sensor 58 to adjust the time keeping function of the clock circuit to compensate for the effect of temperature variations on the time keeping component 56. To this end, the sensor 58 is located proximate the time keeping component 56. By "proximate", it is meant that the sensor 58 is located such that it detects the same general ambient temperature as that to which the time keeping component is exposed. Any location next to or within the meter 50 itself should provide a suitable measurement. However, in order to accommodate possible temperature effects of particular electrical components within the meter, it is preferable to locate the sensor 58 next to or abutting the time keeping component 56.

The sensor 58 is operable to generate an output signal that is representative of the detected temperature The sensor 58 is further operably connected to provide the output signal to the processing circuit 54.

The processing circuit 54 in addition to the above described functions, is further operable to, among other things, adjust the clock information generated by the clock circuit 60 in dependence upon the output signal received from the sensor 58. To this end, the processing circuit 54 may suitably be a microprocessor, microcontroller, digital signal processor, programmable logic device, discrete logic circuit, or a combination of any of the above, along with related circuitry. It is noted that the processing circuit 54 may include separate processors to carry out the time function adjustment operation and the metering information generation operation.

It will be appreciated that the meter 50 and its arrangement for adjusting the time keeping function to account for the effect of temperature variations may take many specific formats. One exemplary embodiment is the exemplary electricity meter shown in FIG. 3, discussed further below.

Figure 2:
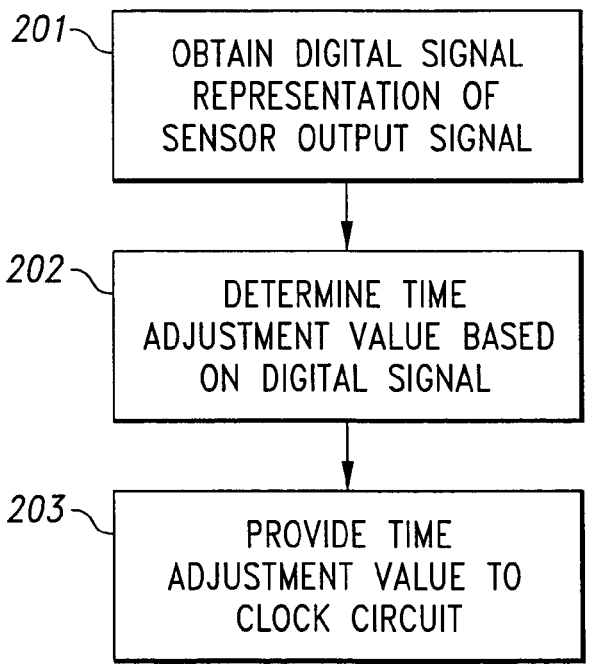
FIG. 2 is a flow diagram of the operations of a processing circuit in accordance with the present invention.

Referring now to FIG. 2, a flowchart illustrating exemplary steps performed by processing circuitry for practicing the present invention. For purposes of explanation and example, the steps of FIG. 2 will be described with reference to the meter 50 of FIG. 1.

In FIG. 2, process flow begins at step 201 where the processing circuitry 54 obtains a digital signal representation of the output signal of the sensor 58. To this end, the processing circuitry 54 may include an analog to digital converter that converts an analog sensor output signal to a digital sensor value. As previously indicated herein, the output signal from the sensor 58 exhibits a voltage level representative of the detected ambient temperature.

Next, at step 202, the processing circuit 54 determines an appropriate adjustment to the clock information generated by the clock circuit 60. To this end, the processing circuit 54 uses a predetermined relationship between temperature and the error of the time keeping component 56 to determine the adjustment. For example, if the time keeping component 56 generates timing signals, e.g. pulses, at a rate that is 0.1% faster for each degree in excess of 25° C., and if the output signal is at level that is consistent with a temperature of 30° C., then the DSP 128 determines that the appropriate adjustment to the clock information would be to reduce the rate at which time is accumulated by 0.5%. The relationship between the error of the time keeping component 56 and the temperature may be determined experimentally, for example, during manufacture of the meter 50. Further detail regarding one method of determining such relationship is provide below in connection with FIG. 3

After the appropriate adjustment is determined by the processing circuit 54, the processing circuit 54 provides the adjustment value to the clock circuit 60. The clock circuit 60 would then adjust its time information in accordance with the adjustment value. Thus, continuing with the above example, the clock circuit 60 would accumulate time, as a function of timing signals received from the time keeping component 56, at a rate that is 0.5% slower than normal. This slower rate compensates for the fact that the time keeping component 56 is providing timing signals 0.5% faster than normal due to the high ambient temperature.

In this manner, the meter 50 performs a temperature compensation function which advantageously improves the accuracy of its time-based metering operations.

Figure 3:
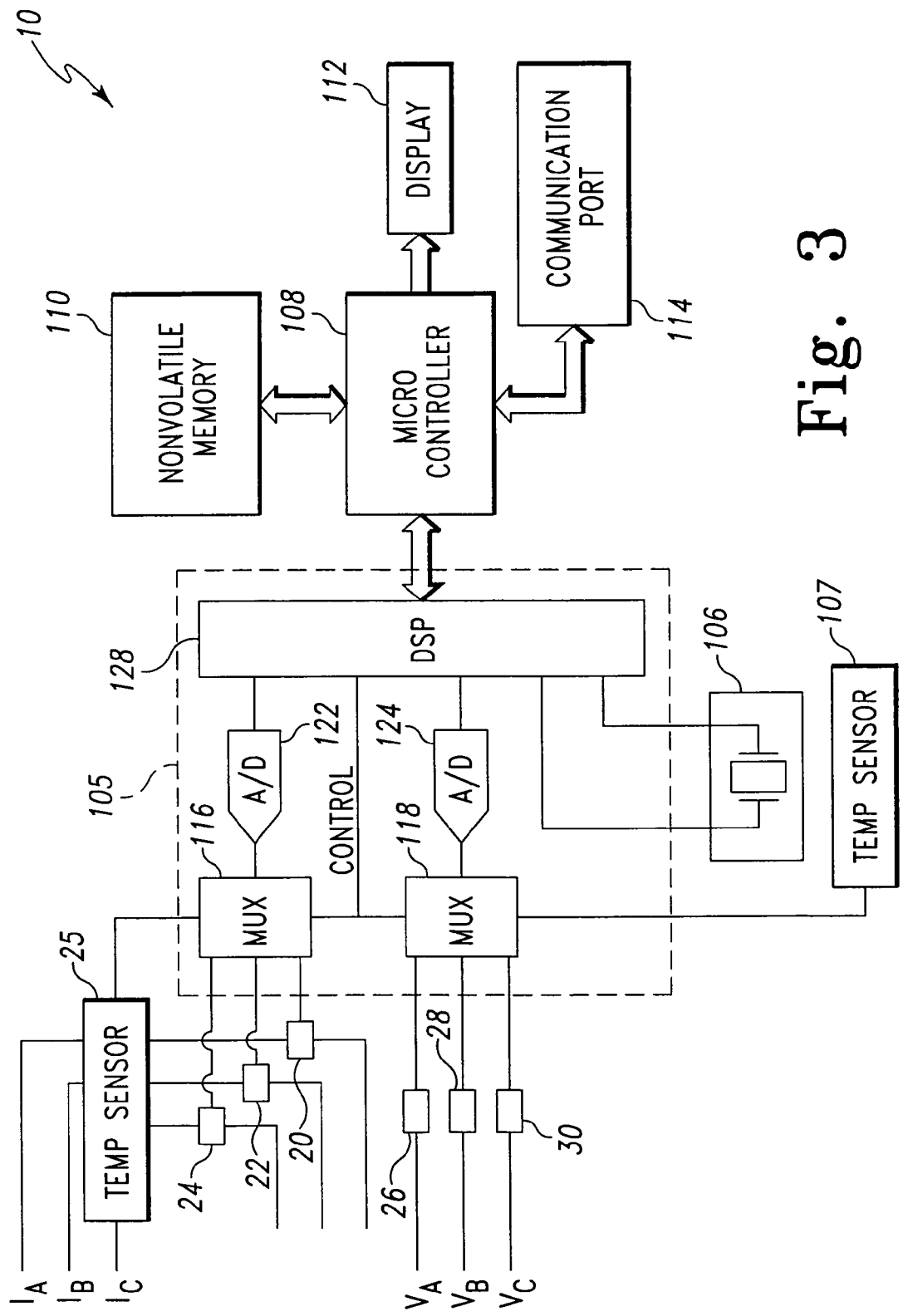
FIG. 3 is a schematic block diagram of an exemplary embodiment of an electricity meter according to the present invention.

Referring now to FIG. 3, a schematic diagram of an exemplary meter suitable for practicing the present invention is shown. For purposes of explanation and example only, the meter of FIG. 3 is shown as an electrical utility meter for monitoring three-phase electrical power. As discussed above, however, the principles of the present invention are applicable to other types of meters which employ a time keeping function.

In FIG. 3, the exemplary meter 10 is a meter intended to, among other things, measure power consumption by a load, not shown, connected to an electric utility, not shown. As will be described herein, the meter 10 performs a temperature compensation function to, among other things, provide a stable time reference upon which customer billing data and other information are based.

The exemplary meter 10 includes polyphase current sensors 20, 22 and 24 having a temperature sensor 25, and polyphase voltage sensors 26, 28 and 30. The meter 10 further includes a conversion circuit 105, a crystal oscillator 106 having a temperature sensor 107, a processor or microcontroller 108, a nonvolatile memory 110, a display 112, and a communication port 114. The conversion circuit 105 comprises a first multiplexer 116, a second multiplexer 118, a first analog-to-digital ("A/D") converter 122, a second A/D converter 124, and a digital signal processor ("DSP") 128. It will be noted that a three-phase electrical utility meter is given by way of example only. Those of ordinary skill in the art may readily adapt the inventive aspects of present invention to other types of meters, such as single phase or network meters.

The current sensors 20, 22 and 24 are each connected to receive signals indicative of the current flowing through one phase of a three phase power line (i.e., phase A, phase B, and phase C). The current sensors 20, 22 and 24 of the exemplary embodiment described herein preferably each include transformers (not shown in FIG. 3), which are advantageously situated to detect current on each respective phase of the power line. The current sensors 20, 22 and 24 are further connected to the conversion circuit 105 through the first multiplexer 116. The temperature sensor 25 detects the ambient temperature proximal to the current sensors 20, 22 and 24 and provides an output signal representative of the detected ambient temperature to the conversion circuit 105 through the first multiplexer 116. The temperature sensor 25 can be embodied as any of a number of different types of solid state sensors. According to a preferred embodiment, the temperature sensor 25 is comprised of a thermal diode and amplifier.

The voltage sensors 26, 28 and 30 are each connected to the respective phase of the power line (i.e., phase A, phase B, and phase C) to obtain a voltage measurement therefrom. To this end, the voltage sensors 26, 28 and 30 may suitably comprise high resistance voltage dividers. The voltage sensors 26, 28 and 30 are further connected to the conversion circuit 105 through the second multiplexer 118.

The conversion circuit 105 is a circuit operable to receive polyphase voltage and polyphase current measurement signals and generate digital signals therefrom, the digital signals including a power consumption signal and voltage and current signals. The conversion circuit 105 also receives signals representative of detected ambient temperature, and adjusts its computations based on the detected ambient temperature. In the exemplary embodiment described herein, the conversion circuit 105 comprises first and second multiplexers 116 and 118, respectively, the first and second A/Ds 122 and 124, respectively, and the DSP 128. The above listed components of the conversion circuit 105 may suitably be incorporated onto a single semiconductor substrate. Such devices are well known and could include the Power Measurement Integrated Circuit found in a model S4 electrical utility meters available from Siemens Power Transmission and Distribution, Inc.

The controller 108 is operably configured to, and executes programming instructions to, receive the digital signals from the conversion circuit 105, monitor and record power consumption using the digital signals, and analyze the digital voltage and current measurement signals and associated phase angle data to determine whether one or more measurement errors is present. The controller 108 may suitably be a K0 series microcontroller available from NEC. However, the controller 108 may alternatively comprise any other suitable processing device or circuit. The controller 108 generally includes firmware, or in other words, an integrated memory into which programming instructions are stored. Alternatively, the programming instructions may be stored in the nonvolatile memory 110.

In operation, the current sensors 20, 22 and 24 detect the phase A current, the phase B current, and the phase C current, respectively, and generate current measurement signals therefrom. The current sensors 20, 22 and 24 may suitably generate the three phase measurement signals contemporaneously and continuously. The current sensors 20, 22 and 24 provide the phase A, phase B and phase C measurement signals, respectively, to the first multiplexer 116. The current measurement signals typically have a voltage level that is indicative of the instantaneous current level on their respective phases. For current transformers designed for utility meter use, the current measurement signals measure from approximately 0.0 volts to 0.3 volts maximum. Other scaling factors may of course be employed.

The temperature sensor 25 is located proximally to the current sensors 20, 22 and 24, and provides an output signal representative of the detected ambient temperature to the first multiplexer 116. According to an exemplary embodiment, the output signal from the temperature sensor 25 has a voltage level representative of the ambient temperature proximal to the current sensors 20, 22 and 24. Further details regarding the temperature sensor 25, and its temperature detecting operation will be provided later herein.

The first multiplexer 116, under the control of the controller 108, then provides the output signal from the temperature sensor 25 and the instantaneous current measurement signals for phase A, phase B, and phase C to the first A/D converter 122. The first multiplexer 116 typically provides each signal in a rapid succession of cycles, such that each signal is provided to the first A/D converter 122 every fourth cycle.

According to the exemplary embodiment described herein, the first multiplexer 116 provides these signals to the first A/D converter 122 at a rate of 2721 Hz.

The first A/D converter 122 receives and samples or digitizes the rapid succession of signals provided by the first multiplexer 116. The first A/D converter 122 then provides to the DSP 128 a stream of digital words, each representing the magnitude of one of the three phase currents (or the ambient temperature proximal to the current sensors 20, 22 and 24) at a particular instant.

Contemporaneously, the voltage sensors 26, 28 and 30 detect the phase A voltage, the phase B voltage, and the phase C voltage, respectively, and generate voltage measurement signals therefrom. The voltage sensors 26, 28 and 30 provide the phase A voltage measurement signal, the phase B voltage measurement signal, and the phase C voltage measurement signal, respectively, to the second multiplexer 118. Each voltage measurement signal is typically a signal having a voltage level that is indicative of the instantaneous voltage level on its respective phase. In the exemplary embodiment described herein, the voltage sensors 26, 28 and 30 are configured to provide voltage measurement signals that range from approximately 0.0 volts to 0.3 volts maximum. Other scaling factors may of course be employed.

The temperature sensor 107 detects an ambient temperature proximal to the crystal oscillator 106 and provides an output signal representative of the detected ambient temperature to the second multiplexer 118. The temperature sensor 107 can be embodied as any of a number of different types of solid state sensors, and is preferably comprised of a thermal diode and amplifier. According to an exemplary embodiment, the output signal from the temperature sensor 107 has a voltage level representative of the ambient temperature proximal to the crystal oscillator 106. As will be explained later herein, the crystal oscillator 106 provides timing signals to the DSP 128 which enables a time keeping function of the meter 10. Accordingly, the output signal from the temperature sensor 107 enables the meter 10 to make time base adjustments necessitated by variations in ambient temperature proximal to the crystal oscillator 106.

The second multiplexer 118 provides the output signal from the temperature sensor 107 and the phase voltage measurement signals in a rapid succession of sequences, such that each signal is provided to the second A/D converter 124 every fourth step of the sequence. According to the exemplary embodiment described herein, the second multiplexer 118 provides the signals at the same rate as that used by the first multiplexer 116 to provide signals to the first A/D converter 122. Moreover, the first multiplexer 116 and the second multiplexer 118 operate in a coordinated fashion to provide certain phase current measurement signals at the same time as certain phase voltage measurement signals. For example, in a four wire wye meter wiring configuration, the first multiplexer 116 provides the phase x current measurement signal and the second multiplexer 118 provides the phase x voltage measurement signal contemporaneously, where x rotates among A, B and C. Likewise, the first multiplexer 116 and the second multiplexer 118 operate in a coordinated fashion to provide the output signal from the temperature sensor 25 at the same time as the output signal from the temperature sensor 107.

The second A/D converter 124 receives and samples or digitizes the rapid succession of signals provided by the second multiplexer 118. The second A/D converter 124 then provides to the DSP 128 a stream of digital words or samples, each representing the magnitude of one of the three phase voltages (or the ambient temperature proximal to the crystal oscillator 106) at a particular instant. The first A/D converter 122 and the second A/D converter 124 thus provide to the DSP 128 the digital current and voltage measurement signals and the digitized output signals from the temperature sensors 25 and 107 in a predetermined synchronous relationship. The DSP 128 within the conversion circuit 105 determines power consumption by selectively multiplying the digital voltage measurement signal samples and the digital current measurement signal samples received from the A/D converters 122 and 124, and then adding them together.

In particular, in a four wire wye meter wiring configuration, the appropriate power calculation is:

$$POWER = V_A I_A + V_B I_B V_C I_C \qquad (1)$$

The DSP 128 carries out the above calculation in the manner described hereinafter. The DSP 128 receives from the first A/D converter 122 a digital output signal originating from the temperature sensor 25 representative of the detected ambient temperature proximal to the current sensors 20, 22 and 24. The DSP 128 shortly thereafter receives from the A/D converters 122 and 124 a digital current measurement signal sample and a digital voltage measurement signal sample, respectively (e.g., for phase A). Based on the ambient temperature proximal to the current sensors 20, 22 and 24, the DSP 128 adjusts the magnitude or phase angle of the current measurement signal sample to compensate for the detected ambient temperature. That is, the DSP 128 adjusts the current magnitude or phase angle in order to compensate for current measurement errors by the current sensors 20, 22 and 24 attributable to ambient temperature.

This adjustment by the DSP 128 is enabled from predetermined temperature data which is stored in the non-volatile memory 110 and provided to the DSP 128 via the controller 108. For example, each current sensor 20, 22 and 24 may have predetermined magnitude and/or phase error that is a function of temperature. Such error functions may be determined experimentally by those of ordinary skill in the art. The relationship may take the form of a polynomial, with the coefficients of the polynomial specifically defining the characteristics of the particular sensor. The coefficients may be determined using by curve fitting a number of error data points observed at different temperatures. The DSP 128 would then generate a compensation value for measured current magnitude on each sensor based on the temperature and the polynomial coefficients for that sensor.

Magnitude errors in current measurement may be carried out by multiplying the current measurement signal sample by an appropriate adjustment factor (derived from the polynomial). Phase errors in current measurement may be carried out by delaying current samples by an appropriate time. While, as discussed above, the magnitude error may be adjusted within the DSP 128, the phase error correction, i.e. the delay, might need to be implemented in the digital or analog voltage stream in order to achieve smaller increments of delay than would be possible in the DSP 128. One suitable phase correction technique employs a programmable delay in the sigma delta modulator of a sigma delta A/D converter. This technique is taught in U.S. patent application Ser. No. 08/904,706, filed Aug. 1, 1997, and which is incorporated herein by reference.

After adjusting the magnitude and/or phase of the current measurement signal sample to compensate for ambient temperature, the DSP 128 multiplies the current and voltage measurement signal samples, and the resulting product is added to a running total or sum. The DSP 128 then receives the next set of digital current and voltage measurement signal samples (e.g., for phase B), and repeats the foregoing process. In other words, if DIG_VOLT$_x$ is the digital voltage measurement signal for a phase x and DIG_CURR$_x$ is the adjusted digital current measurement signal for the phase x, then the DSP 128 carries out the following calculation:

POWER=SUM(DIG_VOLT$_x$*DIG_CURR$_x$) for
x={A,B,C,A,B, . . . } (2)

From time to time, the DSP 128 provides power consumption data derived from POWER to the controller 108.

The controller 108 accumulates the power consumption data until a predefined watt-hour threshold has been reached. At that point, the controller 108 generates a power consumption pulse and increments a power consumption counter. The power consumption counter is the number by which customer power consumption is tracked. For example, as is well known, a utility may determine a particular customer's consumption for a particular billing cycle by subtracting the power consumption counter value at the beginning of the billing cycle from the power consumption counter value at the end of the billing cycle. The controller 108 preferably provides the power consumption counter information to both the nonvolatile memory 110 and the display 112. The display 112 then provides a visual representation of the power consumption counter information from which readings may be taken by utility personnel. The nonvolatile memory 110 stores the power consumption counter information for the purposes of retention in the case of a power interruption.

Optionally, the controller 108 further provides the power consumption counter information, as well as other information, to the communication circuit 114. The communication circuit 114 may then communicate the information over an external communication means, such as a public telephone network, to a central processing facility for the utility. In this manner, the utility may track and bill for power consumption registered by the meter 10 without requiring an employee to physically view the meter.

The controller 108 also generally controls the operation of the conversion circuit 105, and particularly, the first and second multiplexers 116 and 118, respectively, the first and second A/D converters 122 and 124, respectively, and the DSP 128.

In addition to metering power consumption, the DSP 128 also determines and provides other information to the controller 108. In particular, the DSP 128 provides for each phase, the measured voltage magnitude and phase angle data, and the measured current magnitude (which may be adjusted due to temperature) and phase angle data. To determine the measured voltage and current magnitude data, the DSP 128 performs an RMS calculation on each digital voltage measurement signal and each adjusted current measurement signal. This calculation may for example, include, for each phase voltage and current, squaring each sample of the digital measurement signal, and taking the mean of the squared samples over time.

To determine phase angles for each voltage, the DSP 128 uses the time differences between the zero crossings of the phase voltage signals. The time difference between the zero crossing of a particular signal V$_x$ and the V$_A$ signal, plus the direction of the respective zero crossings, provides the phase information. Current phase information is determined using watts per phase and VAR per phase. In particular, a current phase angle for phase x is given by arctan (VAR$_x$/WATTS$_x$).

The DSP 128 provides the measured voltage and current magnitude and phase angle data to the controller 108. Table 1, below shows the measured values so provided.

TABLE 1

| | |
|---|---|
| VRMS$_A$ = | Phase A voltage magnitude |
| VRMS$_B$ = | Phase B voltage magnitude |
| VRMS$_C$ = | Phase C voltage magnitude |
| IRMS$_A$ = | Phase A current magnitude |
| IRMS$_B$ = | Phase B current magnitude |
| IRMS$_C$ = | Phase C current magnitude |
| V<$_A$ = | Phase A voltage phase angle |
| V<$_B$ = | Phase B voltage phase angle |
| V<$_C$ = | Phase C voltage phase angle |
| I<$_A$ = | Phase A current phase angle |
| I<$_B$ = | Phase B current phase angle |
| I<$_C$ = | Phase C current phase angle |

It is noted that the controller 108 may be required to perform some further conversion on the measured data to put it in the form identified in Table 1.

As with other meters, the meter 10, and particularly the controller 108, is operable to generate metering information in using the data received from the DSP 128. Moreover, the controller 108 includes one or more metering operations or generates metering information that requires real-time clock information. To this end, the controller 108 maintains a real time software clock that tracks, among other things, the date, and the time of day to the second. In the embodiment described herein, the controller 108 increments the time in the real time clock upon receiving one-second pulses generated within the DSP 128.

As previously indicated, the meter 10 also performs a temperature compensation function to provide a stable time reference to increase the accuracy of the real time clock information. In particular, the temperature sensor 107 detects an ambient temperature proximal to the crystal oscillator 106, and provides an output signal having a voltage level representative of the detected ambient temperature. Based on the detected ambient temperature, the DSP 128 adjusts the time keeping function of the meter 10. In this embodiment, the DSP 128 adjusts the time keeping function by regulating the rate at which the one-second pulses are generated and provided to the real time clock of the controller 108.

According to an exemplary embodiment, the meter 10 uses the 60 Hz power line frequency to maintain real time clock information (time of day clock) and other interval clocks when power is present. The meter 10 uses timing information generated by the crystal oscillator 106 to maintain those clocks during power outages. However, according to another embodiment, the timing information generated by the crystal oscillator 106 may be used to maintain the clocks both when normal line power is present and during power outages.

The crystal oscillator 106 is operable to generate timing signals in the form of voltage pulses, which are provided to the DSP 128 at fairly precise real-time intervals. According to an exemplary embodiment, the crystal oscillator 106 provides the voltage pulses at a frequency of about 32.768 kHz, which is a commonly used frequency for such timing applications. The DSP 128 includes a clock generator that uses these timing signals to generate the one-second pulses that are provided to the controller 108. As described above, the controller uses the one-second pulses to drive the time of day or real time clock information for the meter 10. In an exemplary embodiment, the DSP 128 generates a one-second pulse by counting the number of pulses received from the crystal oscillator 106 and then generating the one-second pulse after one second's worth of pulses have been received.

It is noted that although only one crystal oscillator 106 is shown in FIG. 3, more than one such oscillator, or other timing keeping device may be used in practice.

According to an exemplary embodiment, the meter 10 is provided with a battery backup (not shown) in the event of a power outage. During a power outage, the DSP 128 uses the timing signals provided by the crystal oscillator 106 to generate the one-second pulses as described above. The controller 108 uses the one-second pulses to maintain the real time clock information. However, the accuracy of the crystal oscillator 106 is typically less than that of the 60 Hz line frequency. Therefore, when the meter 10 is operated from battery backup either during storage or during a power outage, the clocks maintained and the calculations performed by the meter 10 may be adversely affected. Accordingly, the temperature-based time adjustment function of the present invention is beneficial because it increases the accuracy of the clocks maintained within the meter 10.

The temperature sensor 107 preferably comprises a thermal diode such as model type 1N4454A or the like. The forward voltage characteristic of this diode is approximately 0.7 volts+/−0.002 volts per ° C., wherein the voltage level and temperature are inversely proportional. By calibrating the diode at room temperature, it is possible to determine the ambient temperature by subtracting the voltage level measured by the diode (i.e., the voltage level of the output signal from the temperature sensor 107) from the known room temperature voltage, and dividing the result by 0.002. This provides the temperature deviation between the calibration temperature and the ambient temperature measured by the temperature sensor 107.

While other suitable temperature sensors may be used to obtain many of the benefits of the present invention, the use of a thermal diode provides additional cost/benefit advantages. In particular, thermal diodes are relatively inexpensive, and exhibit a temperature dependent relationship that has been found to be particularly useful in this application.

According to an exemplary embodiment, the temperature sensor 25 used to detect the ambient temperature proximal to the current sensors 20, 22 and 24 is identical or equivalent to the temperature sensor 107. Accordingly, descriptions herein regarding the operation of the temperature sensor 107 also apply to the temperature sensor 25.

As an example, consider a situation where the diode of the temperature sensor 107 exhibits a voltage level of 0.7 volts at 20° C. (i.e., the calibration temperature), and the voltage level represented by the output signal of the temperature sensor 107 is 0.710 volts. In this case, the temperature deviation between the calibration temperature and the ambient temperature measured by the temperature sensor 107 is (0.7−0.71)/(0.002)=−5° C. Accordingly, the ambient temperature measured by the temperature sensor 107 is (20−5)=15° C. Knowledge of this relationship may be used in conjunction with knowledge of how the crystal oscillator 106 behaves with respect to temperature to develop the time adjustment value.

Accordingly, once the voltage level of the output signal, which is representative of the ambient temperature detected by the temperature sensor 107 is provided to the DSP 128, the DSP 128 calculates a time offset corresponding to the detected temperature to compensate for temperature-influenced deviations in the operation of the crystal oscillator 106. In particular, the DSP 128 calculates the time offset based on calibration data stored in the non-volatile memory 110 which is provided to the DSP 128 via the controller 108. The calibration data includes information representative of the known frequency versus temperature characteristics of the crystal oscillator 106.

These characteristics are based primarily on the angles of cut of the oscillator's crystal plates with respect to the crystallographic axes of the crystal material (e.g., quartz). Based on the calculated time offset, the DSP 128 adjusts the method in which the one-second pulses are generated to compensate for the detected ambient temperature proximal to the crystal oscillator 106. In this manner, the meter 10 is capable of accurately performing a time keeping function so as to ensure that operations such as "time of use" metering and other time-sensitive matters are properly performed.

The characteristics of the any crystal oscillator 106 may be determined through a simple calibration procedure in which a frequency counter is used to identify the output frequency of the crystal oscillator at various temperatures. Depending upon the number of data points available, an nth order polynomial may be used to model the temperature-dependent behavior of the oscillator 106. The DSP 128 could then be programmed with the coefficients of the polynomial upon initial calibration of the meter 10.

Figure 4:
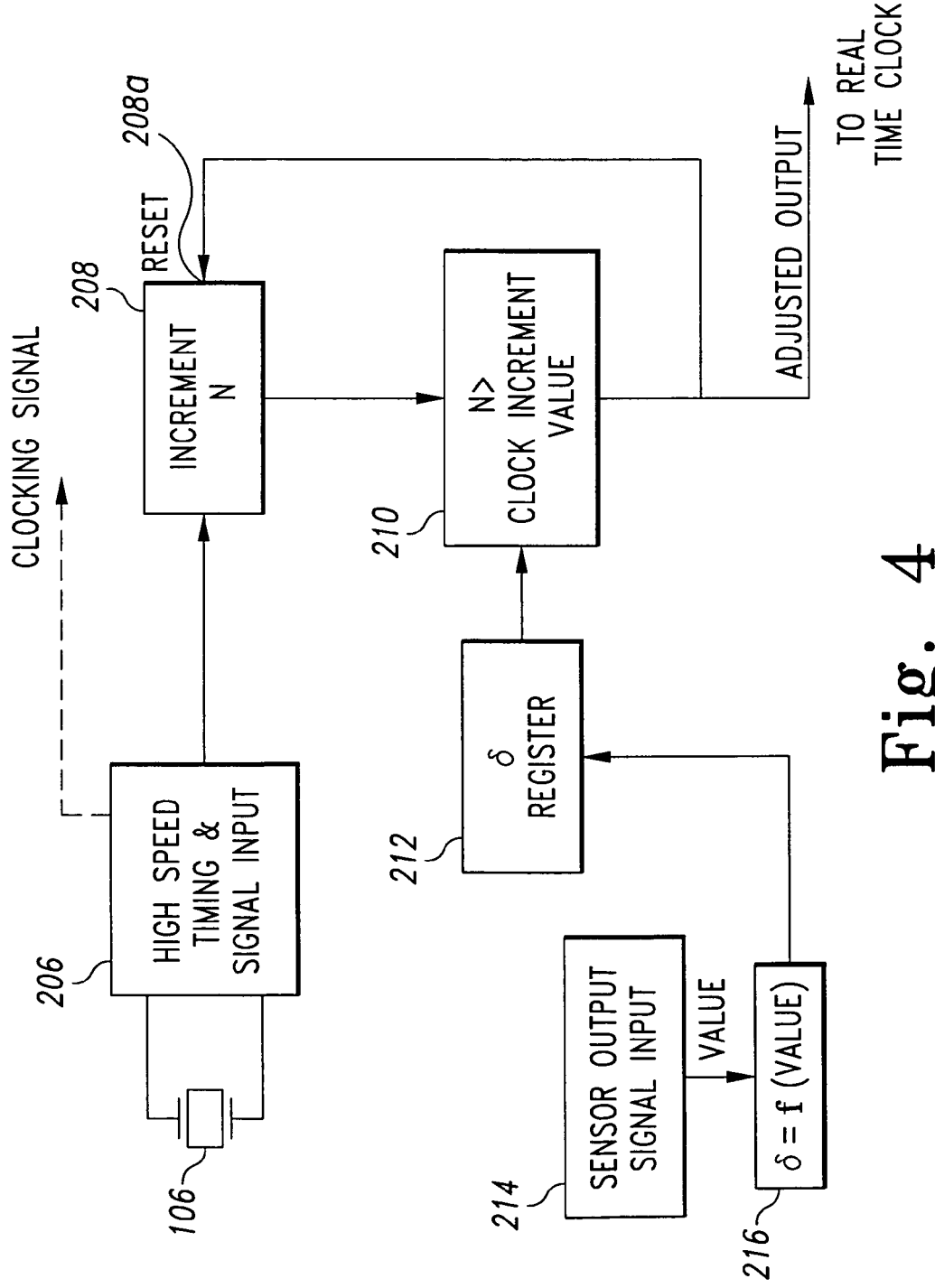
FIG. 4 is a representative block diagram of a portion of the operations of a digital signal processor of the electricity meter of FIG. 3.

FIG. 4 shows an exemplary block diagram of the crystal oscillator 106 and a portion of the DSP 128 that generates the one-second pulses for the real time clock information within the meter 10. It will be appreciated, however, that the block diagram of FIG. 4 is given by way of example only, and other methods of carrying out the functions of the DSP 128 described above to adjust the real time clock information may be devised by those of ordinary skill in the art. Nevertheless, the embodiment of FIG. 4 provides additional advantages that may be desirable in some embodiments.

It will be appreciated that the block diagram format of FIG. 4 is provided for clarity of exposition. Those of ordinary skill in the art may readily implement the functions of the block diagram on a DSP in a manner that suits their particular needs.

Referring now to FIG. 4, the crystal oscillator 106 is operably coupled to provide high speed timing signals to a high speed timing input 206 of the DSP 128. The high speed timing signals are pulses that occur at a frequency of 32.768 kHz, as discussed above. The high speed timing signals may, but need not, be further provided as an output as a clocking signal for other circuit elements of the meter 10. However, in a preferred embodiment, the DSP 128, the microcontroller 108 and other elements employ a separate oscillator, not shown, to provide such clocking signals.

In any event, the high speed timing input 206 is operably coupled to provide the high speed timing signals to a counter 208. The counter 208 accumulates the pulses of the high speed timing signals. The counter value is compared to threshold value called the clock increment value (block 210). The clock increment value is the number of pulses required to trigger a single pulse used by the real time clock information to increment its time keeping value. In the exemplary embodiment described herein, the clock increment value employed in block 210 is chosen such that it equals one second's worth of high speed timing signal pulses.

If the value of the counter 208 exceeds the clock increment value, then the block 210 generates an output pulse, which is the one-second pulse provided to the real time clock information. Thus, every time one second's worth of pulses are received by the counter 208, the block 210 generates an output pulse. The real time clock which in this embodiment is maintained in the microcontroller 108, increments by one second. The block 210 also provides the output pulse to a reset input 208a of the counter 208, which causes the counter to be reset.

Accordingly, in the exemplary embodiment described herein, the nominal clock increment value employed by block 210 is 32768. The clock increment value block 210 is also connected to a delta register 212. The delta register 212 contains an adjustment value by which the clock increment value is adjusted to compensate the time keeping function. The adjustment value may be positive or negative. If the adjustment value is positive, then the clock increment value in block 210 will be higher than 32768. If, however, the adjustment value is negative, then the clock increment value in block 210 will be less than 32768.

As a result, the clock increment value is equal to a nominal value (e.g. 32768) plus or minus the adjustment value provided by the delta register 212. The adjustment value is derived from the detected ambient temperature proximate to the crystal oscillator 106, as discussed further above in connection with FIG. 3.

To this end, the DSP 128 includes a temperature value input 214 that obtains the digital value representative of the sensor output signal. As discussed above in connection with FIG. 3, such value is provided via the multiplexer 118 and the A/D converter 124. The temperature value input 214 provides the digital value to a function block 216. The function block 216 converts the digital value into an adjustment value that is provided to the delta block 212.

As discussed above, the function employed by the function block 216 may be derived using experimental data that correlates the error of the crystal oscillator 106 as a function of temperature. The function may be linear, or a nth order polynomial, or some other function.

Thus, the embodiment of FIG. 4 effectuates the time adjustment by altering the number of high speed pulses that are necessary to increment a slower incremented value of the real time clock information. If the real time clock accumulates time in seconds, and the crystal oscillator 106 operates at frequencies in excess of 10 kHz, then the precision of adjustment may be very high.

The invention described herein thus improves the accuracy of real time clocks in electricity meters. One advantage of the invention is that a relatively low cost, inaccurate crystal may be employed as the timing signal source, at least when the AC power signal is not present. In particular, low cost crystal oscillators have a relatively large temperature-based error. The present invention effectively neutralizes such error thereby resulting in accuracy here to fore only achievable with high cost, low tolerance oscillators.

While this invention has been described as having a preferred design, the present invention can be further modified within the spirit and scope of this disclosure. This application is therefore intended to cover any variations, uses, or adaptations of the invention using its general principles. For example, while the present invention has been disclosed for purposes of example and explanation as an electrical utility meter, the principles of the present invention may be applied to any other type of meter that employs a time keeping function. Further, this application is intended to cover such departures from the present disclosure as come within known or customary practice in the art to which this invention pertains and which fall within the limits of the appended claims.

What is claimed is:

1. An arrangement for adjusting a time keeping function of a utility meter, comprising:
   at least one sensor configured to detect a temperature at a location proximate a time keeping component, the time keeping component generating timing signals at a rate that varies as a function of temperature, the at least one sensor further configured to generate an output signal representative of the detected temperature;
   a processing circuit configured to adjust at least one clock maintained by the time keeping function of the meter in dependence upon the output signal from the at least one sensor.

2. The arrangement of claim 1, wherein the time keeping component comprises a crystal oscillator.

3. The arrangement of claim 1, wherein the processing circuit comprises a digital signal processor.

4. The arrangement of claim 1, wherein the at least one sensor comprises a diode.

5. The arrangement of claim 4, wherein the diode is coupled to the processing circuit through an analog to digital converter.

6. The arrangement of claim 1 wherein the processing circuit is further operable to:
   generate a real time clock output pulse after receiving N timing signals; and
   change N based on the output signal from the at least one sensor.

7. An electricity meter comprising:
   a source of commodity consumption information;
   at least one sensor configured to detect a temperature at a location proximate a time keeping component, the time keeping component generating timing signals at a rate that varies as a function of temperature, the at least one sensor further configured to generate an output signal representative of the detected temperature;
   a processing circuit coupled to receive commodity consumption information from the source of commodity consumption information, the processing circuit configured to generate metering data based on the commodity consumption information and real time clock information, and adjust the real time clock information in dependence upon the output signal from the at least one sensor.

8. The utility meter of claim 7 wherein the processing circuit includes a digital signal processor.

9. The utility meter of claim 8 wherein the processing circuit includes a microcontroller.

10. The utility meter of claim 7 wherein the processing circuit includes at least two processors.

11. The utility meter of claim 7 wherein the source of commodity consumption information comprises a source of electrical energy consumption information.

12. The arrangement of claim 7, wherein the time keeping component comprises a crystal oscillator.

13. The arrangement of claim 7, wherein the at least one sensor comprises a diode.

14. The arrangement of claim 7 wherein the processing circuit is further operable to:
   generate a real time clock output pulse after receiving N timing signals; and
   change N based on the output signal from the at least one sensor.

15. The arrangement of claim 7 wherein:
   the source of commodity consumption information includes a current sensing device, the current sensing device having a temperature dependent characteristic that affects the accuracy of the commodity consumption information;
   the utility meter further comprises at least one additional sensor disposed proximate to the current sensing device, the at least one additional sensor configured to detect a temperature at a location proximate the current sensing device, the additional sensor further configured to generate a second output signal representative of the detected temperature; and the processing circuit is further configured to adjust the energy consumption information in dependence upon the output signal from the at least one additional temperature sensor.

16. The utility meter of claim 7 wherein the source of commodity consumption signals further comprises:

a plurality of voltage sensors operably coupled to a plurality of power lines, the plurality of voltage sensors operable to generate analog voltage measurement signals representative of voltage waveforms on the plurality of power lines;

a plurality of current sensors operably coupled to a plurality of power lines, the plurality of current sensors operable to generate analog current measurement signals representative of current waveforms on the plurality of power lines;

at least one analog to digital converter operable to receive the analog voltage measurement signals and the analog current measurement signals and generate digital measurement signals therefrom;

a digital signal processor operably connected to receive the digital measurement signals from the at least one analog to digital converter, the digital signal processor operable to generate the energy consumption information from the digital measurement signals.

17. The utility meter of claim 16 wherein the digital signal processor further comprises at least a part of the processing circuit.

18. The utility meter of claim 16 wherein:

the current sensing device has a temperature dependent characteristic that affects the accuracy of the analog current measurement signals;

the utility meter further comprises at least one additional sensor disposed proximate to the current sensing device, the at least one additional sensor configured to detect a temperature at a location proximate the current sensing device, the additional sensor further configured to generate a second output signal representative of the detected temperature;

the processing circuit is further configured to adjust the energy consumption information in dependence upon the output signal from the at least one additional temperature sensor.

19. A method for adjusting a time keeping function of a utility meter, comprising:

generating timing signals using a time keeping component that generates timing signals at a rate the varies as a function of temperature;

detecting a temperature at a location proximate to the time keeping component;

generating an output signal representative of the detected temperature; and adjusting at least one clock maintained by the time keeping function of the meter in dependence upon the output signal.

20. The method of claim 19, wherein the time keeping component comprises a crystal oscillator.

* * * * *